(12) United States Patent     (10) Patent No.:   US 12,658,403 B2

Faust et al.        (45) Date of Patent:    Jun. 16, 2026

(54) ELECTRIC FIELD REDUCTION MECHANISM

(71) Applicant: Applied Materials Israel Ltd., Rehovot (IL)

(72) Inventors: Adam Faust, Rehovot (IL); Yosi Basson, Rehovot (IL); Ittamar Levy, Rehovot (IL); Mor Battat, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 183 days.

(21) Appl. No.: 18/768,986

(22) Filed: Jul. 10, 2024

(65)        Prior Publication Data

US 2026/0018371 A1     Jan. 15, 2026

(51) Int. Cl.
*H01J 37/20*       (2006.01)

(52) U.S. Cl.
CPC ....... *H01J 37/20* (2013.01); *H01J 2237/2007* (2013.01)

(58) Field of Classification Search
CPC .......................... H01J 37/20; H01J 2237/2007
USPC ........................................................ 361/234
See application file for complete search history.

(56)        References Cited

U.S. PATENT DOCUMENTS

| | | | |
|---|---|---|---|
| 6,716,301 B2 * | 4/2004 | Kanno | H01J 37/32174 |
| | | | 118/712 |
| 11,121,019 B2 | 9/2021 | Balan et al. | |

| | | | |
|---|---|---|---|
| 2006/0056131 A1 * | 3/2006 | Tanimoto | G03F 7/2059 |
| | | | 361/234 |
| 2007/0029193 A1 | 2/2007 | Brcka | |
| 2010/0019462 A1 * | 1/2010 | Chen | H01J 37/3174 |
| | | | 279/128 |
| 2015/0049411 A1 * | 2/2015 | Wang | H10P 72/72 |
| | | | 361/234 |
| 2022/0181115 A1 * | 6/2022 | Faust | H01J 37/20 |

FOREIGN PATENT DOCUMENTS

| | | | | |
|---|---|---|---|---|
| CN | 110430654 A | * | 11/2019 | H05H 1/26 |

OTHER PUBLICATIONS

Machine translation of Liu et al. Chinese Patent Document CN 110430654 A Nov. 2019 (Year: 2019).*

* cited by examiner

*Primary Examiner* — Kevin J Comber

(74) *Attorney, Agent, or Firm* — Kilpatrick Townsend & Stockton LLP

(57)          ABSTRACT

An electrostatic chuck, that includes (a) an electrostatic chuck body having a top surface and being configured to support a sample; (b) a space formed within the electrostatic chuck body, the space has a top opening; (c) a sharp conductive element; (d) a masking electrode; and (e) a movement unit that is configured to position the masking electrode in a masking position in which the masking electrode reduce an electric field formed by the sharp conductive element when the sharp conductive element is being biased and the top opening is not covered by a backside of the sample.

16 Claims, 7 Drawing Sheets

Figure 7:
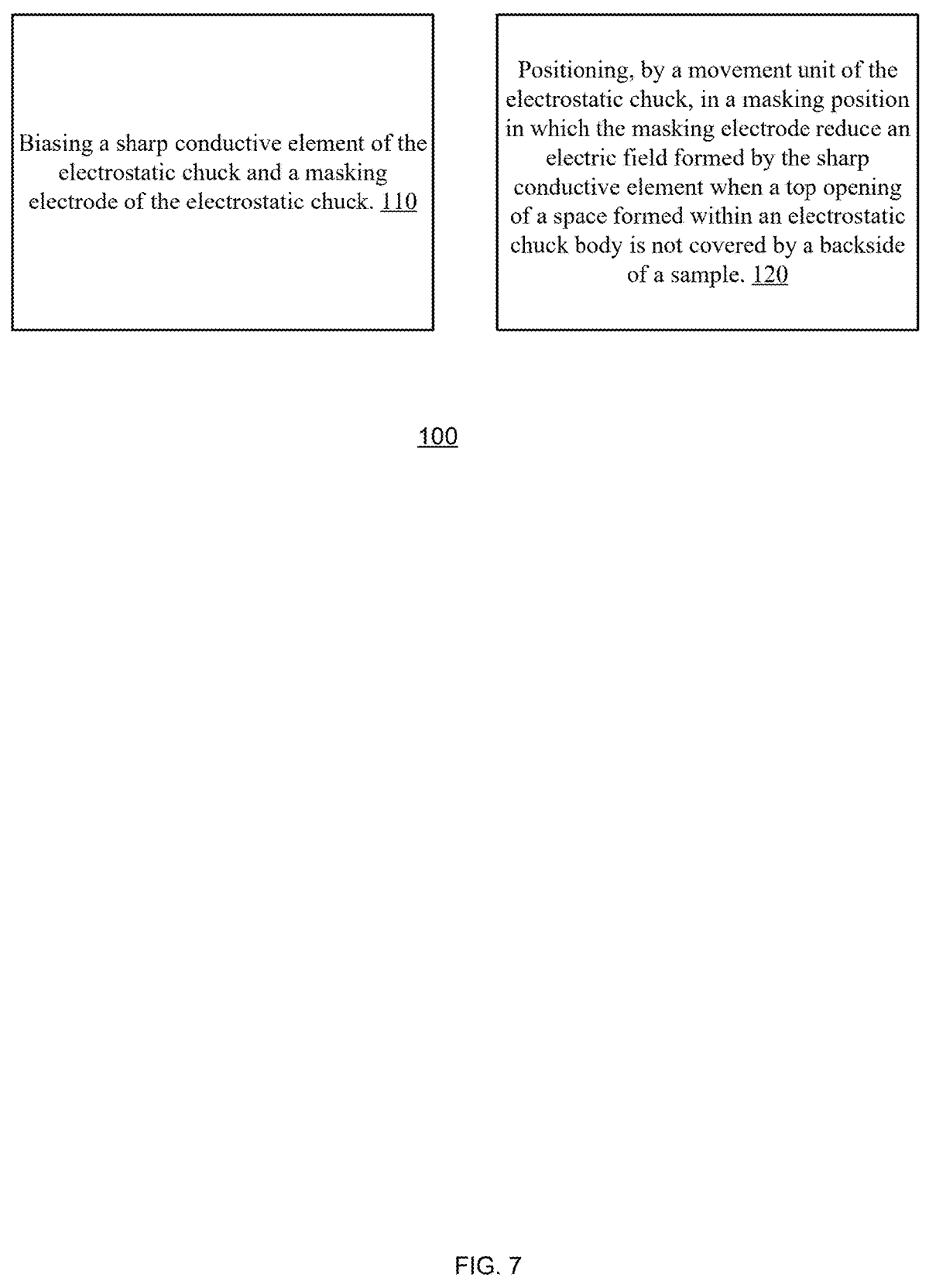

Biasing a sharp conductive element of the electrostatic chuck and a masking electrode of the electrostatic chuck. 110

Positioning, by a movement unit of the electrostatic chuck, in a masking position in which the masking electrode reduce an electric field formed by the sharp conductive element when a top opening of a space formed within an electrostatic chuck body is not covered by a backside of a sample. 120

ELECTRIC FIELD REDUCTION MECHANISM

BACKGROUND OF THE INVENTION

A semiconductor wafer is evaluated by a charged particle system that illuminates the semiconductor wafer with a charged particle beam, using electron optics.

Examples of a charged particle system include (i) a defect review scanning electron microscope SEMVISION™ of APPLIED MATERIALS™ Inc. of San Jose, California, (ii) a metrology system such as the PROVision™ 3E Ebeam™ metrology system of APPLIED MATERIALS™, (iii) an electron beam inspection system such as the PRIMEVISION™ of APPLIED MATERIALS™, or (iv) a critical dimension scanning electron microscope such as the VERITYSEM™ of APPLIED MATERIALS™, and the like. The charge particle system may manufactured by vendors such as HITACHI™ of Tokyo, Japan, or KLA™ Corporation of Milpitas, California, or may be manufactured by other vendors.

During the evaluation of the semiconductor wafer, the semiconductor wafer is positioned on an electrostatic chuck and is electrically biased using a sharp conductive pin that is pressed against the backside of the semiconductor wafer and penetrated through one or more insulating elements of the backside of the semiconductor wafer. The sharp conductive pin is biased by a high valued bias voltage that may exceed 3000, 5000, 10000, 20000 or even 30000 volts.

The charged particle system may include a calibration target that may be used during a testing of a parameter of the charged particle system.

During the testing the sharp conductive pin is biased by a high valued bias voltage, and the electrostatic chuck does not support the semiconductor wafer—so that the electron optics is exposed to the sharp conductive pin.

The sharp conductive pin is biased by the high valued bias voltage—and due to its shape it magnifies (by a factor that may exceed ten) the electrical field at the vicinity of the sharp conductive pin—which may result in a formation of a high voltage arc between the sharp conductive pin and the calibration target. Various parts of the charged particle system may be damaged—for example the electron optics, electron optics interfaces such as the holders of any optical optics component, the coating of the inner walls of the vacuum chambers, and the like.

There is a growing need to provide a solution that prevents the formation of excessive electric fields at a vicinity of the sharp conductive pin when the electrostatic chuck is tested without supporting a semiconductor wafer.

SUMMARY

There is provided an electrostatic chuck as illustrated in the specification.

BRIEF DESCRIPTION OF THE DRAWINGS

The subject matter regarded as the invention is particularly pointed out and distinctly claimed in the concluding portion of the specification. The invention, however, both as to organization and method of operation, together with specimen s, features, and advantages thereof, may best be understood by reference to the following detailed description when read with the accompanying drawings in which:

FIG. 7 illustrates an example of a method.

Figure 1:
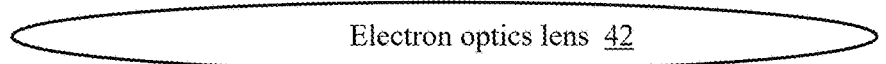
FIG. 1 illustrates an example of an electron optic lens, an electrostatic chuck, and a sample.
Figure 1:
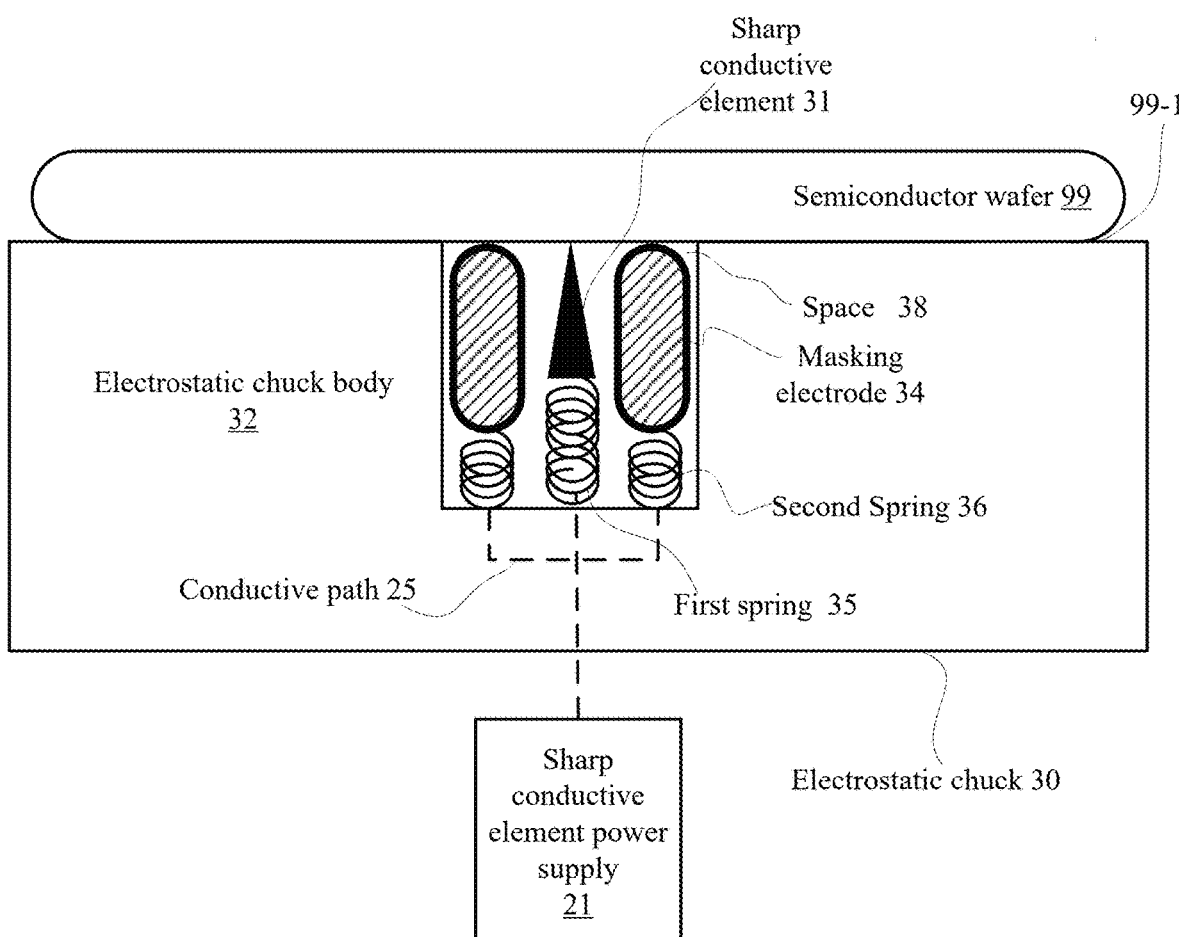

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

There are provided a method an electrostatic chuck for masking a sharp conductive element. The masking reduced the electric field formed by the sharp conductive element and prevents breakdown or arcing.

According to embodiment there is provided an electrostatic chuck that includes:

a. An electrostatic chuck body having a top surface and being configured to support a sample.

b. A space formed within the electrostatic chuck body, the space has a top opening.

c. A sharp conductive element. According to an embodiment, the sharp conductive element is a pin-but it may differ from a pin.

d. A masking electrode.

e. A movement unit that is configured to position the masking electrode in a masking position in which the masking electrode reduce an electric field formed by the sharp conductive element when the sharp conductive element is being biased and the top opening is not covered by a backside of the sample.

According to an embodiment, the movement unit includes a sharp conductive element spring and a masking electrode spring.

According to an embodiment, the sharp conductive element spring is stronger than the masking electrode spring.

According to an embodiment, the sharp conductive element spring is configured to press the sharp conductive element against the backside of the sample when the sample covers the top opening.

According to an embodiment, the movement unit includes a first motorized manipulator that includes a motor for moving the sharp conductive element, and a second motorized manipulator that includes a motor for moving the masking electrode.

According to an embodiment, the masking electrode surrounds the sharp conductive element from all sides of the sharp conductive element.

According to an embodiment, the masking electrode is segmented and partially surrounds the sharp conductive element.

According to an embodiment, a width of a gap between one segment of the masking electrode and another segment is smaller than a height of the masking electrode.

According to an embodiment, a distance between the masking electrode and the sharp conductive element is smaller than a height difference between a top of the masking electrode and a top of the sharp conductive element, when the masking electrode is positioned in the masking position.

According to an embodiment, wherein when positioned at the masking position, a top of the masking electrode is higher than a top of the sharp conductive element.

According to an embodiment, the masking electrode exhibits a radial symmetry about an axis of symmetry.

According to an embodiment, the axis of symmetry is parallel to a longitudinal axis of the sharp conductive element.

According to an embodiment, the masking electrode when positioned at the masking position is configured to reduce the electric field formed by the sharp conductive element by a factor of at least twenty.

According to an embodiment, the electrostatic chuck further includes:

a. An additional space formed within the electrostatic chuck body, the additional space has an additional top opening b. An additional sharp conductive element.

c. An additional masking electrode.

d. An additional movement unit that is configured to position the additional masking electrode in an additional masking position in which the additional masking electrode reduces an additional electric field formed by the additional sharp conductive element when the additional sharp conductive element is being biased and the additional top opening is not covered by a backside of the sample.

According to an embodiment, a minimal radius formed by any portion of an exterior of a top of the masking electrode exceeds by at least a factor of fifty a radius of a top of the sharp conductive element.

FIG. 1 illustrates an example of an electron optic lens 42, electrostatic chuck 30 and a sample such as a semiconductor wafer 99 that is positioned on the electrostatic chuck and covers a top opening of a space 38 formed within an electrostatic chuck body 32.

The electrostatic chuck 30 also includes sharp conductive element 31, masking electrode 34, and a movement unit that includes (a) a first spring 35 that is mechanically coupled to the sharp conductive element 31 and forces the sharp conductive element 31 against a backside 99-1 of the semiconductor wafer 99, and (b) second spring 36 that forces the masking electrode 34 against the backside 99-1 of the semiconductor wafer 99.

According to an embodiment, the sharp conductive element is a pin—but it may differ from a pin.

FIG. 1 also illustrates a sharp conductive element power supply 21 that is configured to bias the sharp conductive element 31 using a conductive path 25 formed at least in part in the electrostatic chuck body 32.

According to an embodiment, the masking electrode 34 is also biased by the sharp conductive element power supply 21 using the conductive path 25.

Figure 2:
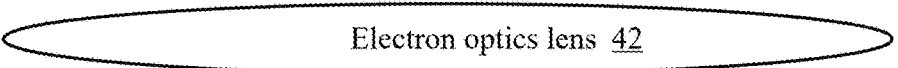
FIG. 2 illustrates an example of an electron optic lens, an electrostatic chuck.
Figure 2:
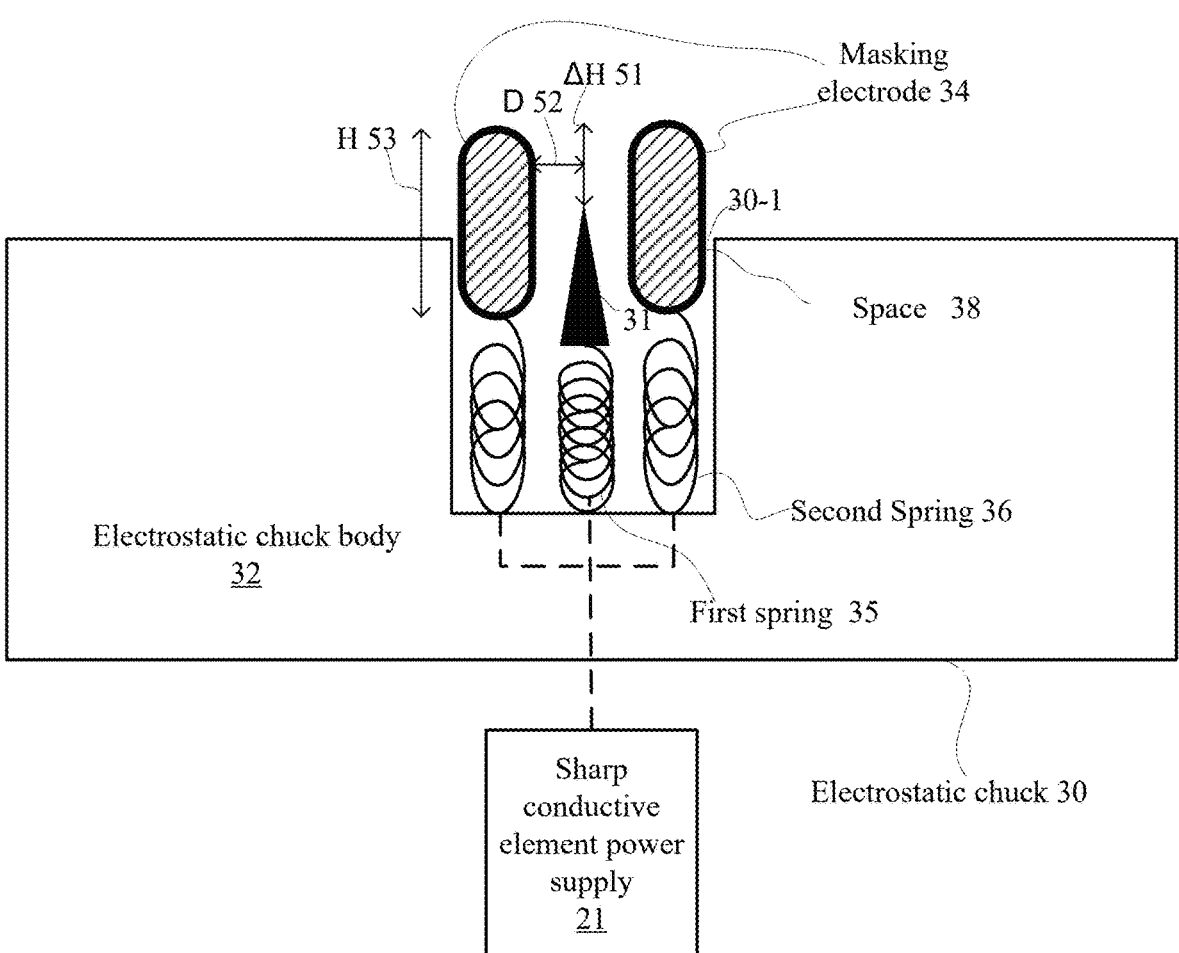

FIG. 2 illustrates an example of an electron optic lens 42 and electrostatic chuck 30. The sample is absent from FIG. 2—and the top opening of space 38 is not covered by semiconductor wafer 99.

In FIG. 2 the movement unit positions the masking electrode 34 in a masking position in which the masking electrode 34 reduce an electric field formed by the sharp conductive element 31 when the sharp conductive element is being biased.

FIG. 2 also illustrates some dimensions:

a. A height (denoted H 53) of the masking electrode 34.

b. A height difference (denoted ΔH 51) between a top of the masking electrode and a top of the sharp conductive element, when the masking electrode is positioned in the masking position.

c. A distance (denoted D 52) between the masking electrode and the sharp conductive element (especially the top of the sharp conductive element 31).

Figure 3:
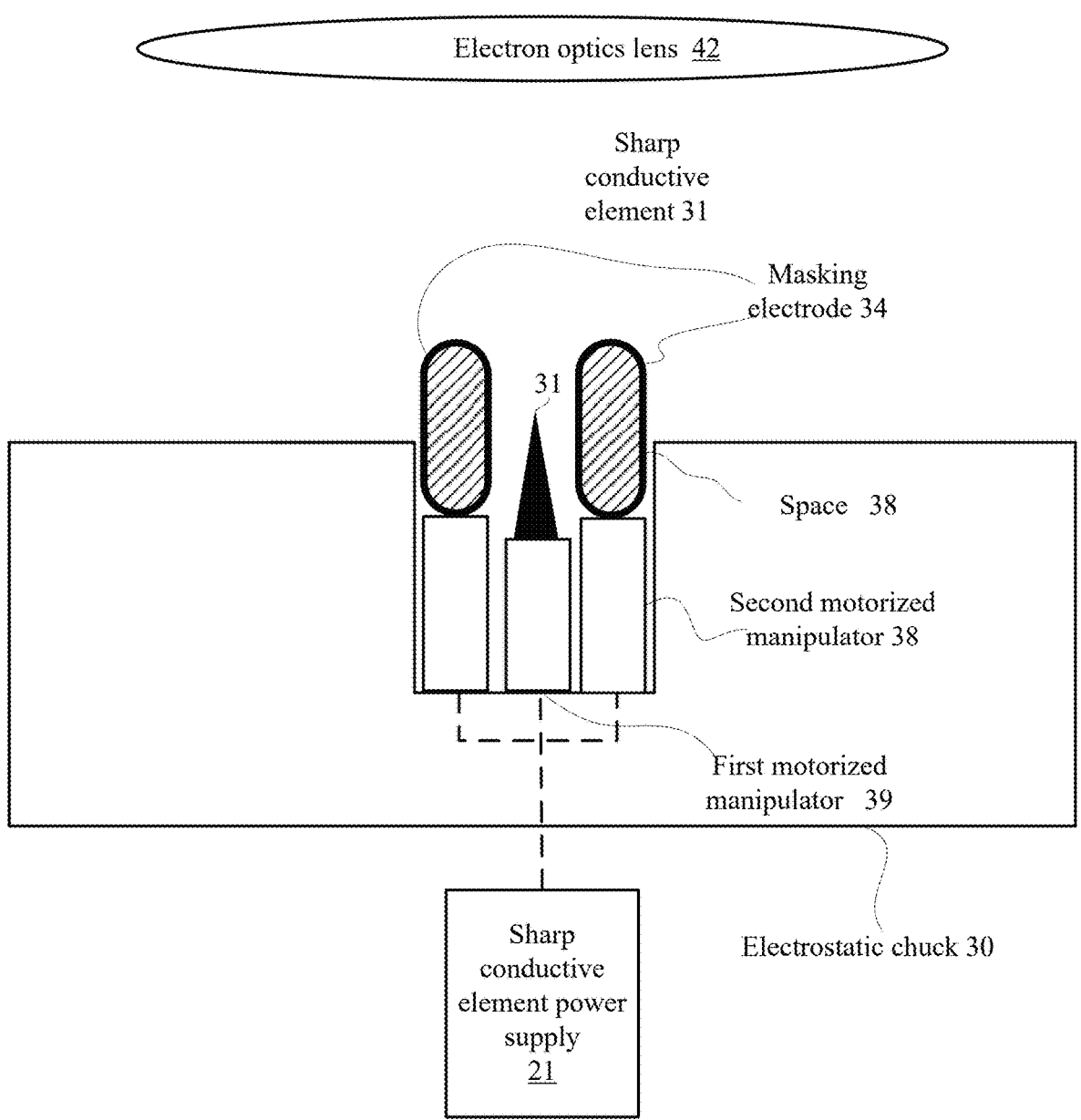
FIG. 3 illustrates an example of an electron optic lens, an electrostatic chuck.

FIG. 3 illustrates an example of an electron optic lens 42 and electrostatic chuck 30. The sample is absent from FIG. 3—and the top opening of space 38 is not covered by semiconductor wafer 99. FIG. 3 differs from FIG. 2 by having a movement unit that includes (instead of the first spring and the second spring) a first motorized manipulator 39 for moving the sharp conductive element 31, and a second motorized manipulator 38 for moving the masking electrode 34.

Figure 4:
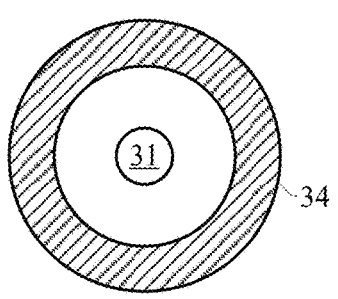
FIG. 4 illustrates examples of sharp conductive elements and masking electrodes.
Figure 4:
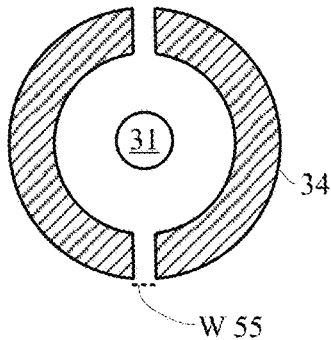
Figure 4:
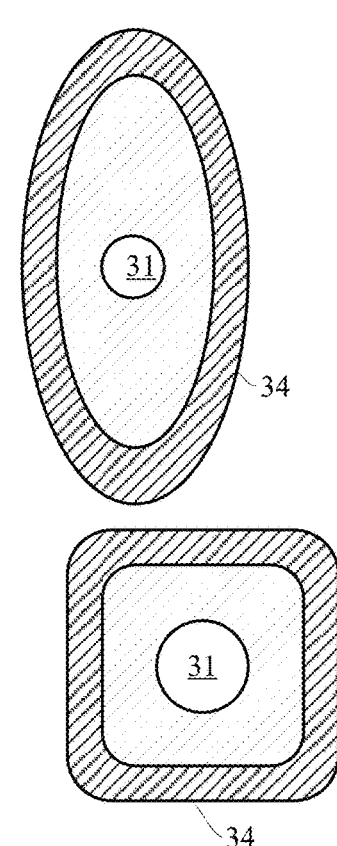

FIG. 4 illustrates examples of sharp conductive element 31 and masking electrode 34.

The masking electrode may of any shape and size.

According to an embodiment the masking electrode should be smoother than the sharp conductive element. For example—while the top of the sharp conductive element has a radius of micron scale (for example between 20 and 100 microns), the masking electrode edges have a radius of millimetric scale (for example between 5 and 100 millimeters).

The masking electrode, when viewed from the top may have an elliptical shape, may have an annular shape, may be continuous or may be segmented.

FIG. 4 illustrates (from top to bottom):

a. A masking electron 34 that is annular shaped and surrounds sharp conductive element 31.

b. A segmented masking electron that includes two curved segments 34-1 and 34-2 that form two gaps having a width (denoted W 55) and surrounds sharp conductive element 31.

c. A masking electron 34 having an elliptical shape and surrounds sharp conductive element 31.

d. A masking electron 34 that has a rectangle shape having round corners—and surrounds sharp conductive element 31.

According to an embodiment, width (W 55) is smaller than a height (denoted H 53 in FIG. 2) of the masking electrode.

Figure 5:
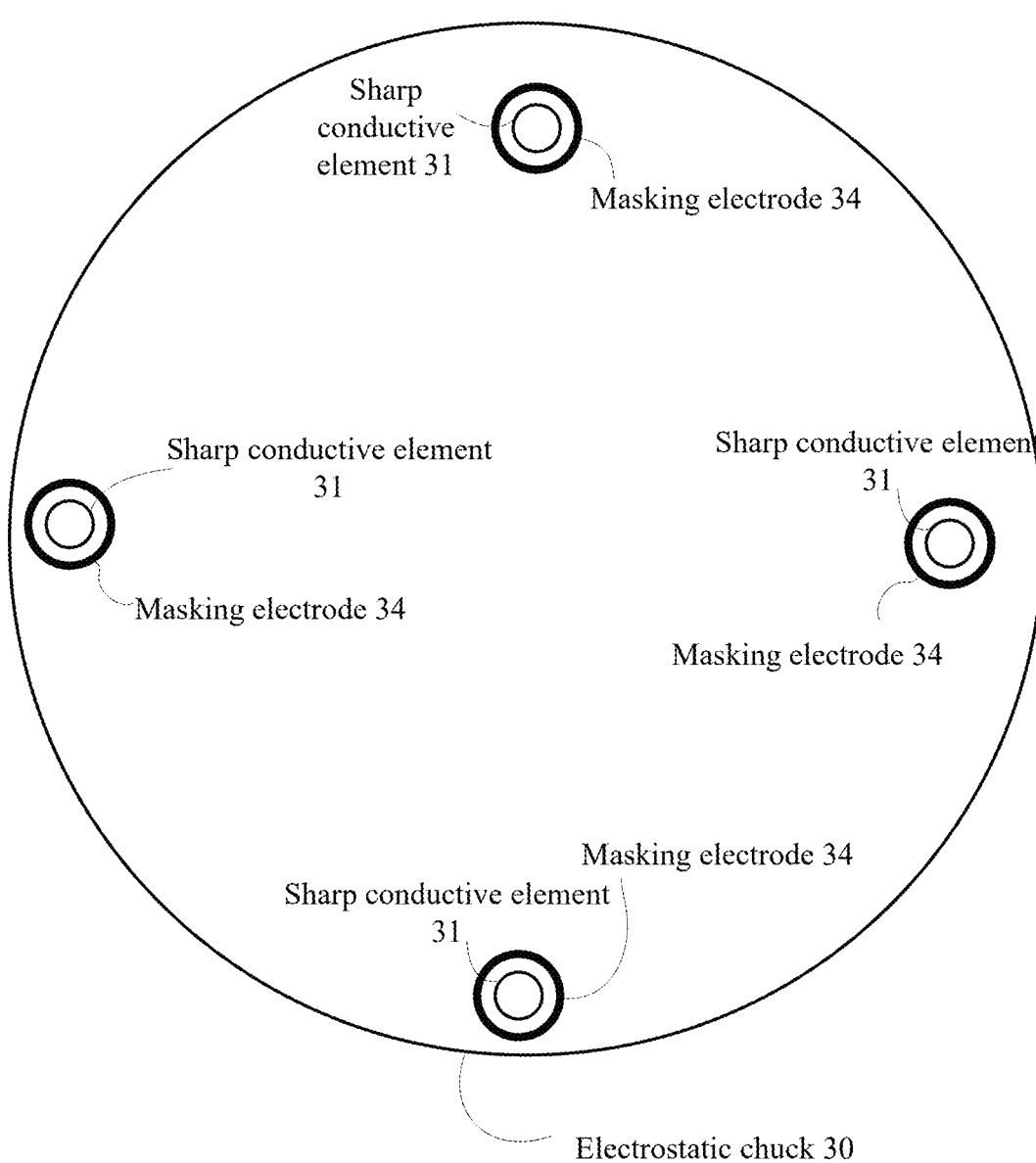
FIG. 5 illustrates an example of electrostatic chuck and instances of sharp conductive elements and masking electrodes.

FIG. 5 illustrates that the electrostatic chuck 30 may include multiple instances (four instances are illustrated in FIG. 5) of a sharp conductive element 31 that is surrounded (or at least partially surrounded) by a corresponding masking electrode 34.

Figure 6:
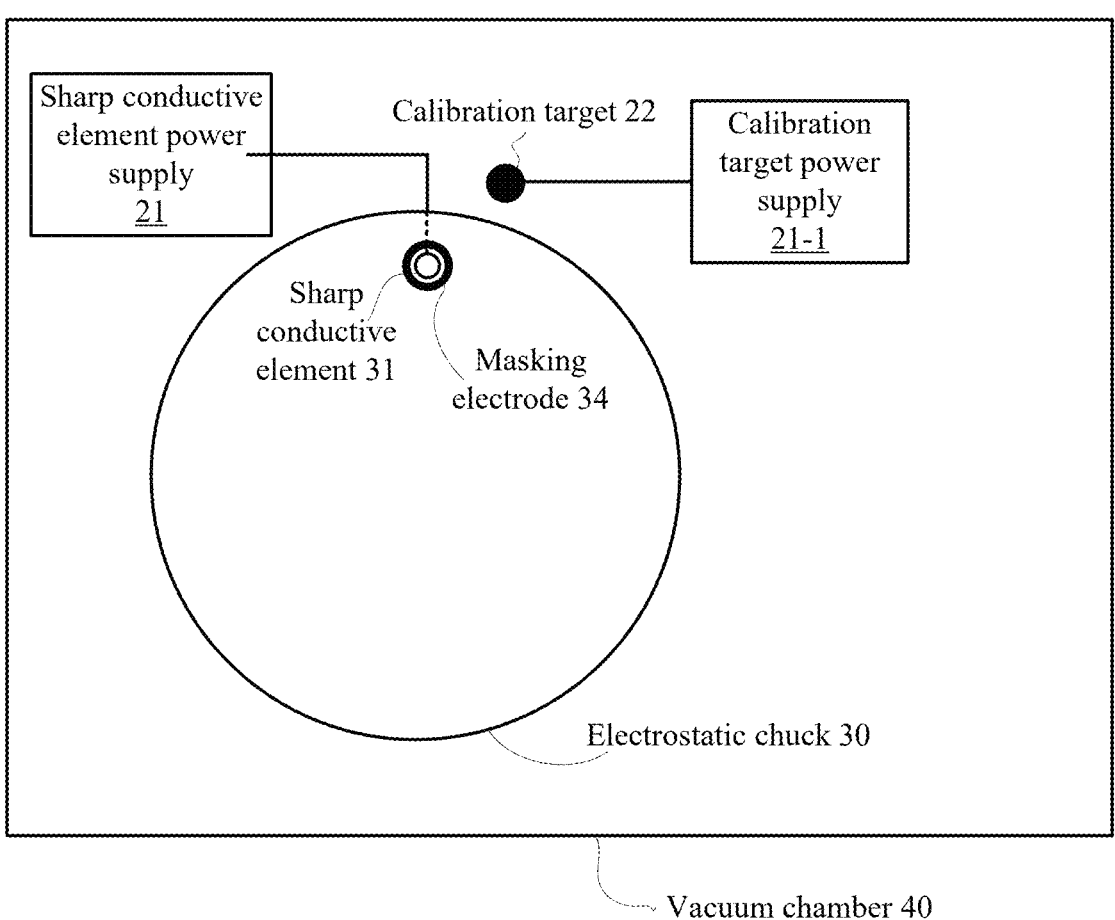
FIG. 6 illustrates an example of an evaluation system.

FIG. 6 illustrates an example of an evaluation system that includes vacuum chamber 40, electrostatic chuck 30 (which does not carry a semiconductor wafer), and calibration target 22. The calibration target 22 is biased by a calibration target power supply 21-1 with a high valued bias voltage. A sharp conductive element power supply biases the sharp conductive element 31 (surrounded by masking electrode 34) with the high valued bias voltage.

Due to the masking effect of the masking electrode 34—no arc is formed—for example no arc is formed between the sharp conductive element 31 and any other element such as the masking electrode 34, the electron optics, a holder of an electron optics component, the vacuum chamber, a vacuum chamber cover, any other conductive elements within the vacuum chamber or the calibration target 22.

The evaluation system also includes electron optics (not shown) that illuminate the sample with a charged particle beam during evaluation of the sample.

FIG. 7 is an example of method 100 for operating an electrostatic chuck.

According to an embodiment, method 100 includes operating any of the electrostatic chucks illustrated in any of the previous figures.

According to an embodiment, method 100 includes steps 110 and 120 that at least partially overlap in timing.

According to an embodiment, step 110 includes biasing a sharp conductive element of the electrostatic chuck and a masking electrode of the electrostatic chuck.

According to an embodiment, step 120 includes positioning, by a movement unit of the electrostatic chuck, in a masking position in which the masking electrode reduce an electric field formed by the sharp conductive element when a top opening of a space formed within an electrostatic chuck body is not covered by a backside of a sample.

In the foregoing detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using mechanical components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term and/or means additionally or alternatively. For example A and/or B means only A, or only B or A and B.

In the foregoing specification, the embodiments of the disclosure have been described with reference to specific examples of embodiments. It will, however, be evident that various modifications and changes may be made therein without departing from the broader spirit and scope of the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any reference to the term "comprising" or "having" or "including" should be applied mutatis mutandis to "consisting" and additionally or alternatively should be applied mutatis mutandis to "consisting essentially of".

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An electrostatic chuck, comprising:

an electrostatic chuck body having a top surface and being configured to support a sample;

a space formed within the electrostatic chuck body, the space having a top opening;

a sharp conductive element;

a masking electrode; and a movement unit configured to position the masking electrode in a masking position in which the masking electrode reduces an electric field formed by the sharp conductive element when the sharp conductive element is biased and the top opening is not covered by a backside of the sample.

2. The electrostatic chuck of claim 1, wherein the movement unit comprises a sharp conductive element spring and a masking electrode spring.

3. The electrostatic chuck of claim 2, wherein the sharp conductive element spring is stronger than the masking electrode spring.

4. The electrostatic chuck of claim 2, wherein the sharp conductive element spring is configured to press the sharp conductive element against the backside of the sample when the sample covers the top opening.

5. The electrostatic chuck of claim 1, wherein the movement unit comprises a first motorized manipulator and a second motorized manipulator.

6. The electrostatic chuck of claim 1 wherein the masking electrode surrounds the sharp conductive element from all sides of the sharp conductive element.

7. The electrostatic chuck of claim 1 wherein the masking electrode is segmented and partially surrounds the sharp conductive element.

8. The electrostatic chuck of claim 7 wherein a width of a gap between one segment of the masking electrode and another segment of the masking electrode is smaller than a height of the masking electrode.

9. The electrostatic chuck of claim 1 wherein a distance between the masking electrode and the sharp conductive element is smaller than a height difference between a top of the masking electrode and a top of the sharp conductive element, when the masking electrode is positioned in the masking position.

10. The electrostatic chuck of claim 1 wherein when positioned at the masking position, a top of the masking electrode is higher than a top of the sharp conductive element.

11. The electrostatic chuck of claim 1 wherein the masking electrode exhibits a radial symmetry about an axis of symmetry.

12. The electrostatic chuck of claim 11, wherein the axis of symmetry is parallel to a longitudinal axis of the sharp conductive element.

13. The electrostatic chuck of claim 11, wherein the masking electrode when positioned at the masking position is configured to reduce the electric field formed by the sharp conductive element by a factor of at least twenty.

14. The electrostatic chuck of claim 1, further comprising:
an additional space formed within the electrostatic chuck body, the additional space has having an additional top opening;
an additional sharp conductive element;
an additional masking electrode; and
an additional movement unit configured to position the additional masking electrode in an additional masking position in which the additional masking electrode reduces an additional electric field formed by the additional sharp conductive element when the additional sharp conductive element is biased and the additional top opening is not covered by a backside of the sample.

15. The electrostatic chuck of claim 1, wherein a minimal radius formed by any portion of an exterior of a top of the masking electrode exceeds by at least a factor of fifty a radius of a top of the sharp conductive element.

16. A method for operating an electrostatic chuck, the method comprising:
biasing a sharp conductive element of the electrostatic chuck and a masking electrode of the electrostatic chuck; and
positioning, by a movement unit of the electrostatic chuck, in a masking position in which the masking electrode reduces an electric field formed by the sharp conductive element when a top opening of a space formed within an electrostatic chuck body is not covered by a backside of a sample.

* * * * *